United States Patent
Park et al.

(10) Patent No.: US 8,007,686 B2
(45) Date of Patent: Aug. 30, 2011

(54) NITRIDE RED PHOSPHORS AND WHITE LIGHT EMITTING DIODE USING RARE-EARTH-CO-DOPED NITRIDE RED PHOSPHORS

(75) Inventors: Joo-Seok Park, Daejeon (KR); Bo-Yoon Jang, Daejeon (KR); Soon-Jae Yu, Kyeonggi-Do (KR); Joon-Soo Kim, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 352 days.

(21) Appl. No.: 12/344,876

(22) Filed: Dec. 29, 2008

(65) Prior Publication Data

US 2010/0163896 A1    Jul. 1, 2010

(51) Int. Cl.
*C09K 11/08* (2006.01)

(52) U.S. Cl. .......... 252/301.4 F; 252/301.4 R; 313/503; 257/98; 257/E23.061

(58) Field of Classification Search ............ 257/98, 257/100, E33.061; 252/301.4 R, 301.4 F; 313/503

See application file for complete search history.

(56) References Cited

U.S. PATENT DOCUMENTS

| 2007/0007494 A1* | 1/2007 | Hirosaki et al. ....... 252/301.4 R |
| 2008/0083931 A1* | 4/2008 | Bando et al. ................. 257/99 |

* cited by examiner

*Primary Examiner* — Victor A Mandala
*Assistant Examiner* — Scott Stowe
(74) *Attorney, Agent, or Firm* — Baker & Hostetler LLP

(57) ABSTRACT

Disclosed are nitride red phosphors and white light emitting diodes using the same. More particularly, the present invention provides a nitride red phosphor with easily controlled composition of phosphor fraction and improved uniformity and color gamut thereof, a method for preparation thereof, a white light emitting diode with excellent color rendition and high light emitting efficiency, and a white light emitting diode package using the same.

17 Claims, 6 Drawing Sheets

NITRIDE RED PHOSPHORS AND WHITE LIGHT EMITTING DIODE USING RARE-EARTH-CO-DOPED NITRIDE RED PHOSPHORS

FIELD OF THE INVENTION

The present invention relates to nitride red phosphors and a white light emitting diode using the same and, more particularly, to a novel nitride red phosphor with easily controlled composition of a phosphor fraction and improved uniformity and reproduction of color, a method for preparation thereof, a novel white light emitting diode with high color continuity and light emitting efficiency fabricated using the nitride red phosphor as a light source, and a white light emitting diode package using the same.

DESCRIPTION OF THE RELATED ART

An effort for application of a light emitting diode ("LED") as a lighting began in around the late 1990s. A global market scale for phosphors used for lightings reached about USD 2 billion in 2006 and the market scale for LED lightings is estimated to grow up by about 20% every year, accomplishing more than USD 10 billion in 2012. Comparing to conventional lighting equipment, LEDs have superior reliability and longer lifespan, as well as reduced maintenance expenses and power consumption, thus considerably reducing energy consumption. Moreover, the LEDs have merits of flexibility in designs and reduced heat generation to satisfy requirements for lighting applications.

Based on technological knowledge in relation to green (G) and blue (B) LEDs as first developed GaN based LEDs, red (R), green and blue colors as three primary colors of light were obtained from the LEDs. Thereafter, as a result of continuous technological researches and developments, a white LED using YAG based phosphors together with a B-LED was developed and advanced technologies for use of R, G and B phosphors in UV LEDs are now underway.

Recently, white LEDs are widely used in, for example, a backlight unit (BLU) light source for a display of a cellular phone, a flash light source of a cellular phone equipped with a camera device, a BLU light source for an LCD monitor, and so forth and, owing to a rapid increase in energy costs, and have drawn attention for use thereof in novel lighting equipment as an alternative of conventional incandescent lamps and/or fluorescent lamps. Therefore, a number of studies and investigations into development of such light equipment using white LEDs are currently conducted.

A white LED exhibits light emitting efficiencies substantially equal to fluorescent lamps and even several times higher than common incandescent lamps. In addition, a lifespan of the white LED is 10 times longer than the fluorescent lamp and even 20 times longer than the incandescent lamp. Therefore, LED lighting equipment manufactured even under the present level of technology can reduce energy consumption by at least 80%, compared to existing lighting equipment. Accordingly, such LED lighting equipment has consolidated its position as new and innovative lighting equipment. Due to the current high prices, it will still take some time till the LED lighting equipment is generally distributed in the market. However, considering the period of high oil prices these days, application of the above innovative technology may considerably save energy costs and it is expected that the distribution of LED lighting equipment to the market will be noticeably extended in the near future.

As a process for fabrication of a lighting using a semiconductor light source, there was proposed a combination of YAG based phosphors having yellow color with a blue LED so as to produce a white LED.

Another white LED with an improved color rendering index was fabricated by combining R, G, B or yellow-red color phosphors with a near-UV or violet LED.

Still further, a white LED fabricated by combining together R, G and/or B-LEDs was also disclosed.

However, the white LED comprising YAG based phosphors and the B-LED exhibited a low color rendering, limited light emitting efficiencies due to stokes shift and a weak thermal resistance, requiring improvement thereof.

The white LED comprising the B-LED and YAG based phosphors uses both wavelengths for blue and yellow colors, leading to a low color rendering.

FIG. 1 is a graph illustrating a wavelength spectrum distribution of a conventional white LED according to prior art.

FIG. 1 shows the wavelength spectrum of the white LED comprising the B-LED and YAG based phosphors.

Referring to FIG. 1, it can be seen that an emission intensity is sharply reduced in a wavelength area between blue and green colors, resulting in a decrease in color rendering index (Ra).

FIG. 2 is a CIE chart illustrating a conventional white LED according to prior art.

In FIG. 2, B-LED means a blue color LED, Y-phosphor partially represents yellow color that was wavelength-converted from a part of blue color by YAG based phosphor. White light indicated as W was shifted along a line connecting the B-LED and the Y-phosphor.

Referring to FIG. 2, since the white LED represented both the blue and the yellow wavelengths with lack of a red color component, the color rending index Ra of the white LED is low in the range of 60 to 75, which is insufficient to use the white LED for normal interior lighting.

As is apparent from the above description, a conventional process for generation of white light using a YAG phosphor, which is well known as a process for fabrication of a white LED, has problems in technical aspects, such as low efficiencies of the phosphor, a lack of red color component causing a low color rendering, less uniformity in mixing ratios of epoxy resin and phosphors, inferior color gamut, etc.

Accordingly, although the conventional white LEDs using R, G and B LEDs exhibits the highest light emitting efficiency without light loss, there is still a need for precise control of a driver in order to practically embody a perfect white color. In addition, since products manufactured generally have large dimensions and all of three LEDs (R, G and B) have different temperature characteristics, these factors may have an influence on optical properties and reliability of the manufactured product.

SUMMARY OF THE INVENTION

Accordingly, the present invention has been proposed to solve conventional problems described above and an object of the present invention is to provide a novel nitride red phosphor with easily controlled composition of a phosphor fraction and improved uniformity and reproduction of color (often referred to as "color gamut"), wherein the nitride phosphor is excited using light emitted from an LED without use of YAG phosphors, and then, the emitted red light is used.

Another object of the present invention is to provide a method for preparation of the nitride red phosphor described above including a normal pressure sintering (NPS) process conducted under ordinary gas atmospheric pressure, which does not require a grinding process and is suitable for mass production.

A further object of the present invention is to provide a novel white LED using the nitride red phosphor as a light source, so as to exhibit high color rendering and light emitting efficiencies and to have excellent thermal stability and chemical resistance.

Yet another object of the present invention is to provide a novel white LED package including the white LED as a light emitting part, wherein the white LED uses the nitride red phosphor described above as a light source, so as to exhibit high color rendering and light emitting efficiencies.

In order to achieve the above objects of the present invention, there is provided a nitride red phosphor represented by the following Formula 1:

$$Ba_{2-x}Re_xAl_ySi_{5-y}N_8 \quad \text{[Formula 1]}$$

wherein x and y as molar ratios are defined by $0.0001 \leq x \leq 1.0$ and $0.001 \leq y \leq 5.0$, respectively, and Re is at least one element selected from rare-earth elements or transition metal elements.

The nitride red phosphor may be activated by the rare-earth element.

The nitride red phosphor preferably has an excitation wavelength ranging from 300 to 500 nm and an emission wavelength ranging from 500 to 800 nm.

As for the nitride red phosphor, Re is preferably at least one metal selected from a group consisting of Ce, Pr, Eu, Tb, Yb, Er and Mn.

In order to accomplish the above objects, the present invention also provides a method for preparation of the nitride red phosphor described above, comprising: a first step of heat treating a dried precursor mixture at 500 to 900° C. and ordinary pressure under a gas atmosphere; and a second step of sintering the heat treated mixture at 1,400 to 1,800° C. and ordinary pressure under a gas atmosphere.

In the above method, the gas is selected from nitrogen, argon, a mixture of hydrogen and nitrogen and a mixture of carbon monoxide and carbon dioxide.

In order to accomplish the above objects, the present invention also provides a white LED including the nitride red phosphor described above, wherein the nitride red phosphor is excited by a light source for an LED at 300 to 500 nm wavelength range to generate an emission wave having a wave band of 500 to 800 nm so that the diode emits the white light using the emission wave.

As for such a white LED, the light source for the light emitting diode has a dominant wavelength ranging from 390 to 480 nm.

As for the white LED, red light emitted by the nitride red phosphor has a peak wavelength ranging from 600 to 680 nm.

As for the white LED, Re of the nitride red phosphor is Eu, while x and y as molar ratios are defined by $0.0001 \leq x \leq 1.0$ and $0.001 \leq y \leq 5.0$, respectively.

As for the white LED, the nitride red phosphor is combined with a transparent epoxy or silicon resin and is applied to a chip constituting the LED light source by a dispensing process.

As for the white LED, the nitride red phosphor is combined with a transparent epoxy or silicon resin and applied to a chip constituting the LED light source by a transfer molding process.

As for the white LED, the nitride red phosphor is combined with a transparent epoxy or silicon resin and applied to a chip constituting the LED light source by a sputtering or deposition process.

In order to accomplish the above objects, the present invention also provides a white LED package including the nitride red phosphor described above, wherein the nitride red phosphor is excited by a light source for an LED at 300 to 500 nm wavelength range to generate an emission wave having a wave band of 500 to 800 nm so that the diode package emits the white light using the emission wave.

As for such a white LED package, the package may be fabricated in a shell form.

As for the white LED package, the package may be fabricated in a surface-mounted form.

As for the white LED package, the surface-mounted package preferably has an epoxy lens.

The white LED of the present invention exhibits high color rendition and light emitting efficiencies sufficient to be used in lighting applications and, in addition, may be expected to accommodate industrial activation in related arts such as manufacturing of LEDs, phosphors, etc.

BRIEF DESCRIPTION OF THE DRAWINGS

These and other objects, features, aspects, and advantages of the present invention will be more fully described in the following detailed description of preferred embodiments and examples, taken in conjunction with the accompanying drawings. In the drawings.

DETAILED DESCRIPTION OF THE INVENTION

Figure 1:
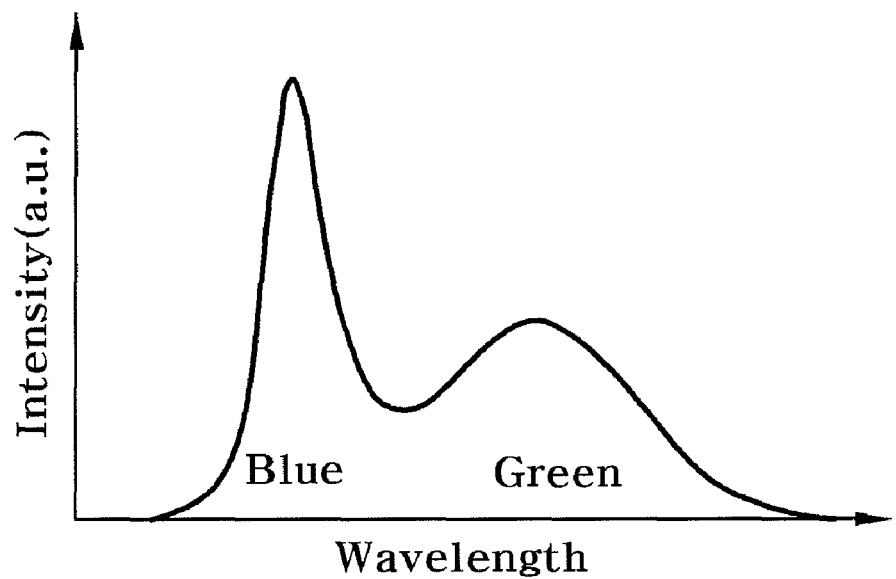
FIG. 1 is a graph illustrating a wavelength spectrum distribution of a conventional white LED of a prior art.
Figure 2:
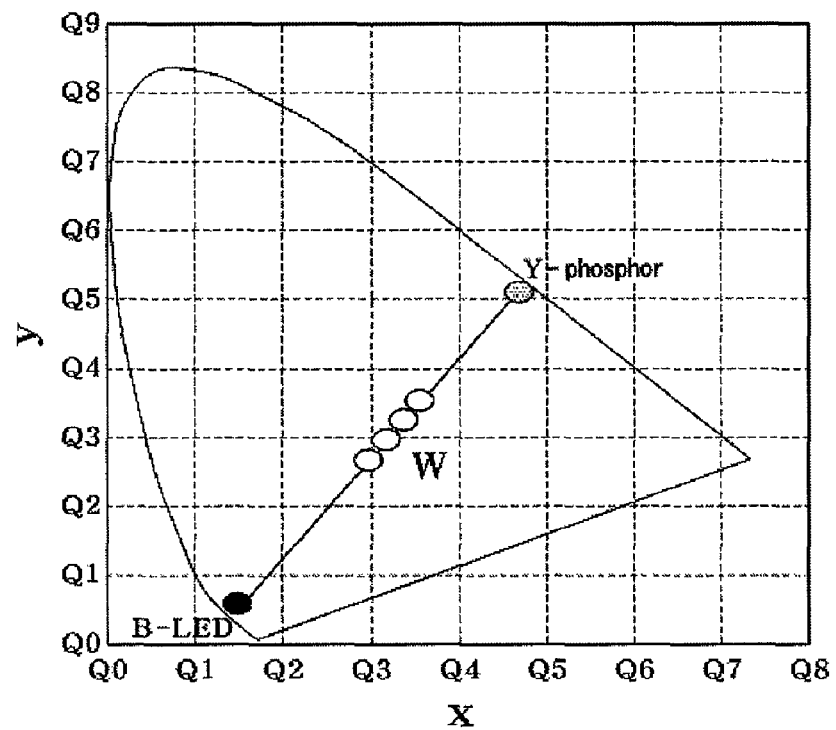
FIG. 2 is a CIE chart illustrating a conventional white LED of the prior art.

According to the present invention, a nitride red phosphor represented by the following formula 1 comprises an oxide, sulfide and/or nitride containing at least one transition metal or rare-earth ion in order to promote light emission:

$$Ba_{2-x}Re_xAl_ySi_{5-y}N_8 \quad \text{[Formula 1]}$$

wherein x and y as molar ratios are defined by 0.0001≦x≦1.0 and 0.001≦y≦5.0, respectively, and Re is at least one element selected from rare-earth elements or transition metal elements.

Such a nitride red phosphor of the present invention may further contain α-SiAlON ceramic to form an improved phosphor having more excellent thermal stability and chemical resistance.

The nitride red phosphor of the present invention uses silicon aluminum nitride compounds as a base material to have an absorption spectrum in a wavelength region of 300 to 500 nm and to exhibit excellent emission efficiencies in a wider wavelength region such as at 500 to 800 nm, preferably 520 to 700 nm, and more preferably 600 to 650 nm. Therefore, if this nitride red phosphor is used in a white LED, composition of a phosphor fraction may be easily controlled while improving uniformity and color gamut of the phosphor.

Such base compounds may have varied emission characteristics and/or physical properties of the phosphor by adding at least one metal selected from a group consisting of Ce, Pr, Eu, Tb, Yb, Er and Mn.

From the above formula 1, an amount of Re to be added, that is, x preferably ranges from 0.0001 to 1.0. If the x value is less than 0.0001, an amount of an activating agent is too small to lead to emission of the phosphor, causing a decrease in emission intensity and deteriorating wavelength conversion efficiency of the phosphor. On the other hand, when the x value exceeds 1.0, the activating agent excessively added to the phosphor causes light extinction in the phosphor which in turn results in a problem of reduced efficiency.

A method for preparation of a phosphor composition represented by the formula 1 according to the present invention is not particularly limited but includes a solid state method, a liquid state method and/or a vapor state method. Applying the solid state method, rare-earth metal nitrides such as silicon nitride ($Si_3N_4$), magnesium nitride ($Mg_3N_2$), barium nitride ($Ba_3N_2$), barium hydroxide ($Ba(OH)_2$), aluminum nitride (AlN), aluminum hydroxide ($Al(OH)_3$), rare-earth metal nitride such as europium nitride (EuN), etc.; rare-earth metal hydroxides such as europium hydroxide ($Eu(OH)_3$), etc.; or rare-earth metal oxides such as europium oxide ($Eu_2O_3$), etc. are ground and mixed in a glove box containing high purity nitrogen or argon, followed by drying the mixture. The resultant mixture is primarily heat treated at 500 to 900° C. (first heat treating temperature) and ordinary pressure under a gas atmosphere, and then, is sintered at 1,300 to 1,800° C. (second sintering temperature) and ordinary pressure under a gas atmosphere containing at least 5% hydrogen, so as to produce the phosphor composition described above.

The gas used herein may include nitrogen gas, argon gas, a gas mixture of hydrogen and nitrogen or a gas mixture of carbon monoxide and carbon dioxide.

A sintering process used herein is generally divided into first and second stages. The first stage substantially comprises heat treatment conducted at 500 to 900° C. in order to remove moisture or organic materials contained in the mixture and optionally other impurities such as complex compounds of some salts while accelerating growth of crystals. In the case where the first sintering temperature is not more than 500° C., the crystals are not favorably generated. On the other hand, if the temperature is more than 900° C., unreacted materials which are undesirable may be generated in the mixture and may prevent the second stage of sintering the mixture to produce a final product, causing a reduction in wavelength conversion efficiency of the phosphor.

When the second sintering temperature is not more than 1,400° C., phosphor ingredients are insufficiently synthesized, thus not accomplishing desired emission intensity as a wavelength characteristic. On the other hand, with the temperature of more than 1,800° C., the phosphor ingredients are molten at a high temperature to form an amorphous phase which in turn reduces the emission intensity and, a volatility of the phosphor ingredients at high temperature causes difficulty in production of a powder product with desired physical properties.

Since commercially available $CaAlSiN_3:Eu^{+2}$ phosphors are generally prepared at high temperatures of 1,800 to 2,200° C. and under high pressures of 1 to 20 MPa, these require complicated equipment and involve a problem in that the phosphor must be crushed or ground into particles with desired sizes.

However, a method for preparation of a nitride red phosphor according to the present invention adopts a normal pressure sintering (NPS) conducted at ordinary pressure under a gas atmosphere in place of a gas pressure sintering (GPS) commonly used in conventional processes in the related art and, in addition, does not require a grinding process. Therefore, the inventive method may be easily conducted using a simple apparatus and be adequately used in mass production thereof.

A white LED of the present invention may include the nitride red phosphor $Ba_{2-x}Re_xAl_ySi_{5-y}N_8$ described above, wherein the nitride red phosphor is excited by a light source for an LED at 300 to 500 nm wavelength range to generate an emission wave having a wave band of 500 to 800 nm so that the diode package emits the white light using the emission wave.

A dominant wavelength of such a white LED preferably ranges from 390 to 480 nm, while a peak wavelength of red light emitted by the nitride red phosphor preferably ranges from 600 to 650 nm.

Hereinafter, the present invention will be described in more detail with reference to accompanying drawings.

Figure 7:
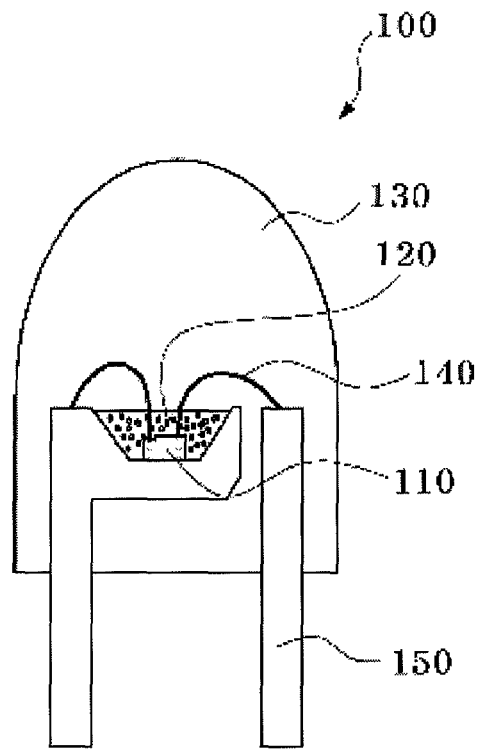
FIG. 7 is a schematic view illustrating a shell type white LED package using the nitride red phosphor according to the present invention.

FIG. 7 is a schematic view illustrating a shell type white LED package using the nitride red phosphor according to the present invention.

Referring to FIG. 7, a blue LED 110 comprises an InGaN activated layer and a substrate may be a sapphire substrate or a silicon carbide (SiC) substrate.

After die-bonding the blue LED 110 to a lead frame 150, a gold wire bonding 140 is conducted thereon in order to connect electrodes to the outside environment. As for a sapphire substrate, this substrate has p and n type electrodes on a top portion of a device, each of which requires the gold wire bonding 140. As for a SiC conductive substrate, the substrate needs only one gold wire bonding 140. After the gold wire bonding 140, a mixture of an epoxy resin and the phosphor is applied to a region 120 using a dispenser or other proper processes in order to attain white light emission.

Next, the coated product is cured at a certain temperature to prevent the coating from flowing out and an epoxy lens 130 is fabricated using a mold with a desired shape. After that, and then trimming and cutting the lead frame 150, a shell type white LED lamp 100 is fabricated.

In order to more particularly embody the present invention, a shell type lamp is fabricated by varying fractions of the epoxy resin and the nitride red phosphor $Ba_{2-x}Re_xAl_ySi_{5-y}N_8$ and is subjected to measurement of color rendering index, color temperature and spectrum thereof. For example, 0.1 g, 0.2 g, 0.3 g, 0.4 g and/or 0.5 g of the phosphor is added to 100 μl of a transparent epoxy resin and this mixture is applied to a diode by a dispensing process, resulting in a transparent epoxy lamp.

Figure 8:
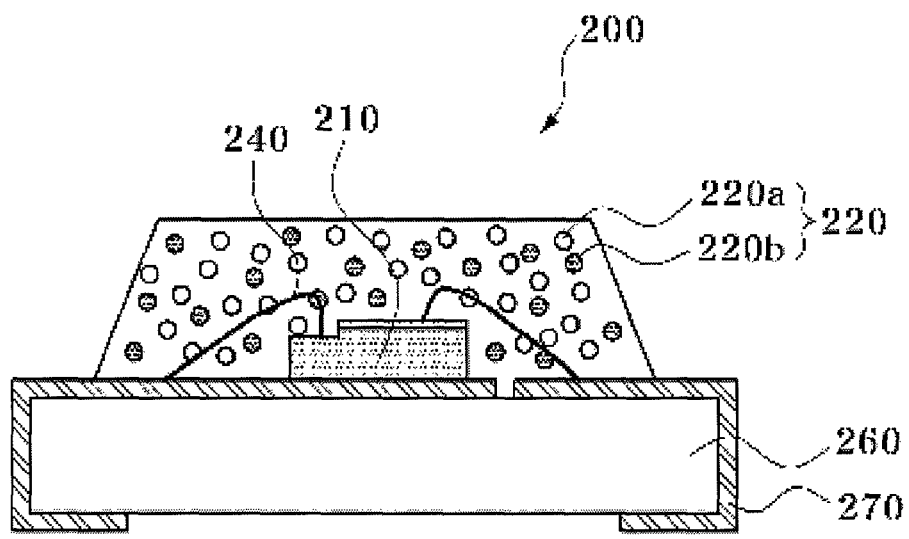
FIG. 8 is a schematic view illustrating a surface-mounted white LED package using a blue LED according to the present invention.
Figure 9:
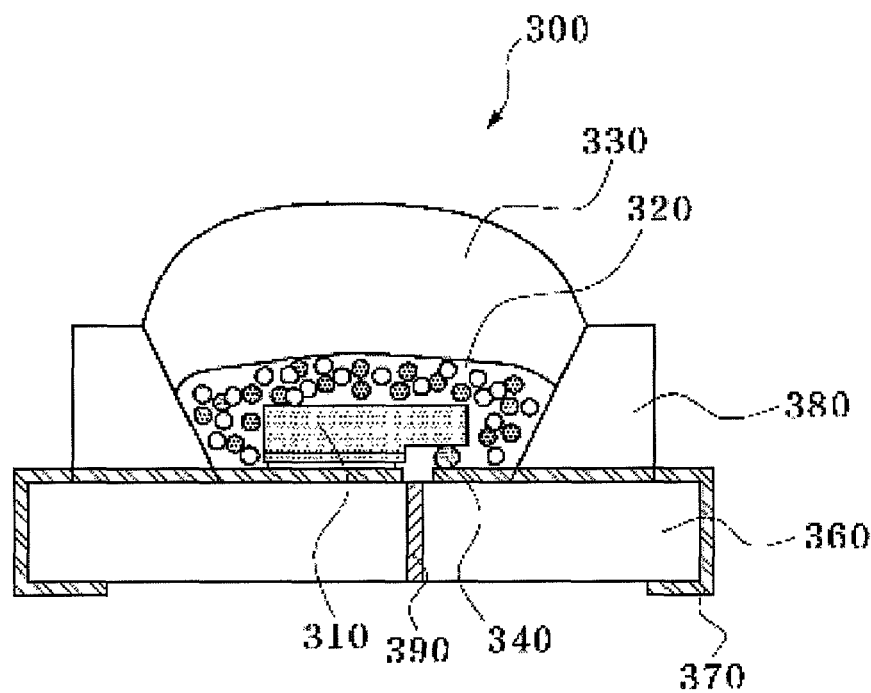
FIG. 9 is a schematic view illustrating an epoxy lens type surface-mounted white LED package according to the present invention.

Additionally, package type diodes with different forms may be fabricated and, especially, SMD or SMT type LEDs may be fabricated as illustrated in FIGS. 8 and 9, respectively.

FIG. 8 is a schematic view illustrating a surface-mounted white LED package using a blue LED according to the present invention.

Referring to FIG. 8, a blue LED 210 is die-bonded on metal wires 270 of a PCB substrate 260. Next, p and n type electrodes of the diode are treated by gold wire bonding 240 to the metal wires 270 in order to connect the electrodes to the outside environment. After the gold wire bonding, a mixture of an epoxy resin 220 and the nitride red phosphor $Ba_{2-x}Re_xAl_ySi_{5-y}N_8$ 200a and 200b is applied to the blue LED 210. After that, the mixture is molding treated using a dispenser, or otherwise, is solidified in a transfer mold form to complete a surface mounted white LED lamp 200.

FIG. 9 is a schematic view illustrating an epoxy lens type surface-mounted white LED package according to the present invention.

Referring to FIG. 9, a package comprises a PCB substrate or a ceramic substrate 360 wherein metal wires 370 are attached to an anode part and a cathode part and the substrate 360 is divided into two parts by an insulator 390. A region 380 having an epoxy resin is enclosed therein, inside which a reflection film coated with aluminum or silver is formed to reflect light emitted by the diode upward and which encloses the epoxy resin therein. A violet LED 310 is die-bonded in a flip-chip form using a gold bumper or a bonding material 340 such as Au—Sn compound, followed by dispensing an epoxy or silicon resin 320, which contains green and red phosphors combined together in a desired mixing ratio, to the diode. Such a silicon resin 320 may be used for a high output LED package. The silicon resin 320 may prevent adverse effect to reliability of a chip caused by thermal stress directly transferred to the chip and/or inhibit short-circuiting of a gold wire caused by thermal contraction or expansion. Since the silicon resin 320 has a refractive index higher than that of an epoxy resin, using the silicon resin may reduce reflection of light emitted from the diode on an interfacial surface which in turn may improve brightness (often referred to as "emission intensity") of the light.

As such, after the epoxy or silicon resin 320 containing the phosphor is applied to the diode, an epoxy lens 330 is formed thereon. Herein, a shape of the epoxy lens 330 may be varied at desired orientation angles thereof.

Hereinafter, preferred embodiments of the present invention will be described in detail in the following examples and experimental examples which are given for illustrative purposes only and should not be construed as limiting the spirit and scope of the invention.

EXAMPLES 1 TO 5

Preparation of Nitride Red Phosphors $Ba_{2-x}Re_xAl_ySi_{5-y}N_8$

After silicon, aluminum, barium and europium precursors, that is, $Si_3N_4$, AlN, $Ba_3N_2$, $Ba(OH)_2$, $Eu(NO_3)_3$ and $Eu_2O_3$ were mixed together in stoichiometric ratios, a small amount of isopropanol solvent was added to the mixture. Then, the prepared mixture was ground and blended in a glove box filled with nitrogen gas, followed by drying the blended slurry in a vacuum dryer at 80° C.

The agglomerated powder was sieved to uniformly disperse the powder and the dispersed powder was entered into an alumina reactor. The powder in the reactor was firstly subjected to heat treatment at 800° C. and ordinary pressure under a nitrogen atmosphere for 5 hours, followed by sintering at 1,500° C. and ordinary pressure under a nitrogen atmosphere containing 5% hydrogen. Finally, the resulting product was washed using distilled water.

Herein, with varying amounts of Eu and Al, that is, x and y which were added as activating materials, as shown in the following TABLE 1, nitride red phosphors of the present invention were prepared.

TABLE 1

| Eu and Al amounts (x and y) added to nitride red phosphors | | |
|---|---|---|
| Example | Eu amount (x) | Al amount (y) |
| Example 1 | 0.01 | 1.0 |
| Example 2 | 0.1 | 2.0 |
| Example 3 | 0.5 | 3.0 |
| Example 4 | 0.85 | 4.0 |
| Example 5 | 1.0 | 5.0 |

EXAMPLES 6 TO 10

Preparation of Nitride Red Phosphors $Ba_{2-x}Re_xAl_ySi_{5-y}N_8$

After silicon, aluminum, barium and praseodymium precursors, that is, $Si_3N_4$, AlN, $Ba_3N_2$, $Ba(OH)_2$, $Pr(NO_3)_3$ and $Pr_2O_3$ were mixed together in stoichiometric ratios, a small amount of isopropanol solvent was added to the mixture. Then, the prepared mixture was ground and blended in a glove box filled with nitrogen gas, followed by drying the blended slurry in a vacuum dryer at 80° C.

The agglomerated powder was sieved to uniformly disperse the powder and the dispersed powder was entered into an alumina reactor. The powder in the reactor was firstly subjected to heat treatment at 800° C. and ordinary pressure under a nitrogen atmosphere for 5 hours, followed by sintering at 1,500° C. and ordinary pressure under a nitrogen atmosphere containing 5% hydrogen. Finally, the resulting product was washed using distilled water.

Herein, with varying amounts of Pr and Al, that is, x and y which were added as activating materials, as shown in the following TABLE 2, nitride red phosphors of the present invention were prepared.

TABLE 2

| Pr and Al amounts (x and y) added to nitride red phosphors | | |
|---|---|---|
| Example | Pr amount (x) | Al amount (y) |
| Example 6 | 0.01 | 1.0 |
| Example 7 | 0.1 | 2.0 |
| Example 8 | 0.5 | 3.0 |
| Example 9 | 0.85 | 4.0 |
| Example 10 | 1.0 | 5.0 |

EXPERIMENTAL EXAMPLE 1

Excitation Emitting Properties of Nitride Red Phosphor

Figure 3:
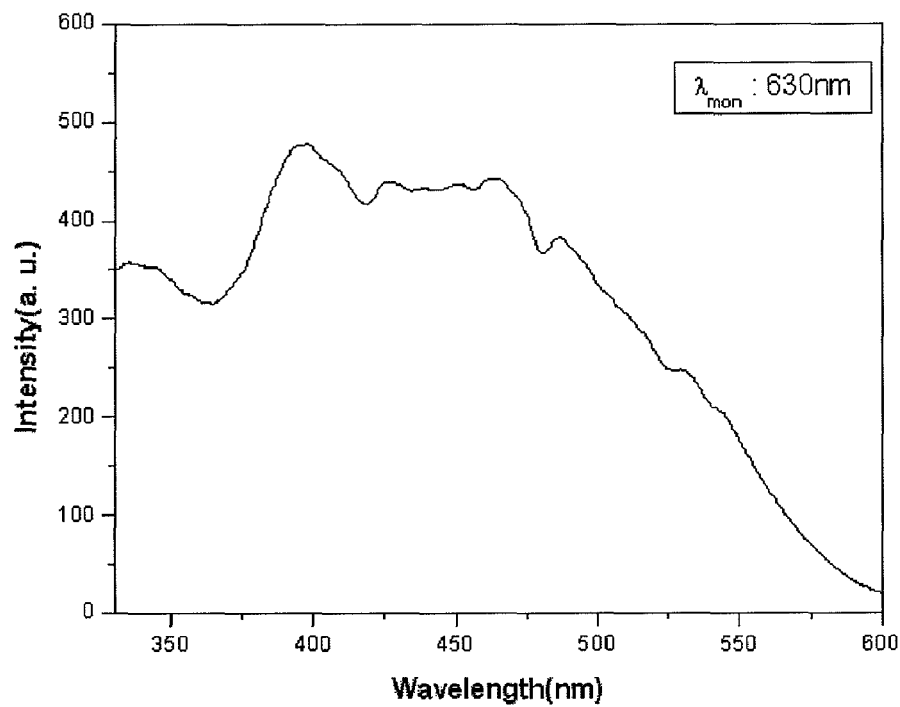
FIG. 3 is a graph illustrating UV excitation emitting properties of a nitride red phosphor according to the present invention.

Excitation emitting properties of the nitride red phosphor according to the present invention are shown in FIG. 3.

FIG. 3 is a graph illustrating blue excitation emitting properties of the nitride red phosphor according to the present invention. Referring to FIG. 3, as for the nitride red phosphor $Ba_{2-x}Re_xAl_ySi_{5-y}N_8$ calcined at 1,300 to 1,800° C., excitation and emission spectra were measured while varying the x value in a range of 0.0001 to 0.4 and the y value in a range of 0.001 and 5 and the measured results were illustrated in FIG. 3. Measurement of spectra was carried out using a PL apparatus, Perkin Elmer LS 55, and the result obtained by monitoring the spectra at a red emission wavelength $\lambda_{mor}$ of 630 nm in order to determine an optimum excitation wavelength was illustrated as a graph in FIG. 3. Herein, since the nitride red phosphors with a combination of different x values substantially showed the same spectrum, the graph was depicted as a single line.

A maximum excitation wavelength exhibiting the highest intensity was 392 nm, wherein the x value was 0.12 and the y value was 0.5.

From experimental results of the phosphors with most of combined compositions, it was found that the maximum excitation wavelength was near 392 nm while the range of the excitation wavelength was extended to 500 nm.

EXPERIMENTAL EXAMPLE 2

Emission Characteristics of Nitride Red Phosphor

Figure 4:
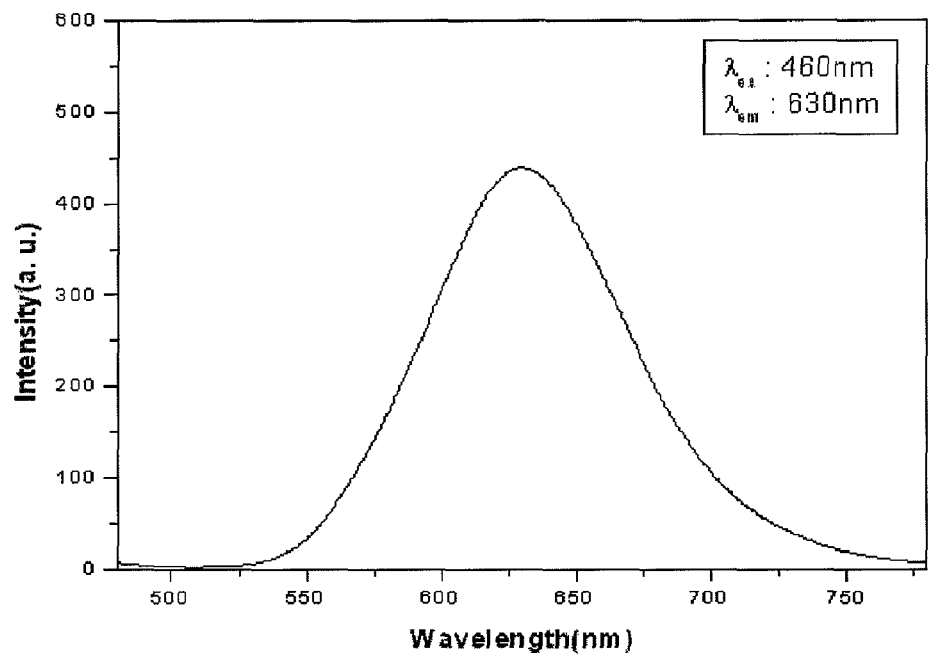
FIG. 4 is a graph illustrating emission properties of a red region at 630 nm caused by blue light excitation at 460 nm of the nitride red phosphor according to the present invention.

FIG. 4 shows measured results of emission characteristics of the nitride red phosphor according to the present invention. FIG. 4 is a graph illustrating emission characteristics $\lambda_{em}$ in a red region at 630 nm caused by blue light excitation $\lambda_{ex}$ at 460 nm of the nitride red phosphor according to the present invention.

Referring to FIG. 4, as for the nitride red phosphor $Ba_{2-x}Re_xAl_ySi_{5-y}N_8$, it was understood that the phosphor has the highest intensity when the x value is 0.215 with reference to the results in FIG. 3 and the intensity is a maximum value at 630 nm.

As for an emission spectrum of the nitride red phosphor $Ba_{2-x}Re_xAl_ySi_{5-y}N_8$, as the x value is increased from 0.01 to 0.3, a maximum emission spectrum is shown at a longer wavelength side. Moreover, it can be seen that a wide wave band at 500 to 800 nm may show the maximum emission spectrum, and an emission peak exhibits a narrowed wave band with an increase in Eu content in the phosphor $Ba_{2-x}Re_xAl_ySi_{5-y}N_8$ and, in addition, is shown at a longer wavelength side.

EXPERIMENTAL EXAMPLE 3

Measurement of X-Ray Diffraction Pattern of Nitride Red Phosphor

Figure 5:
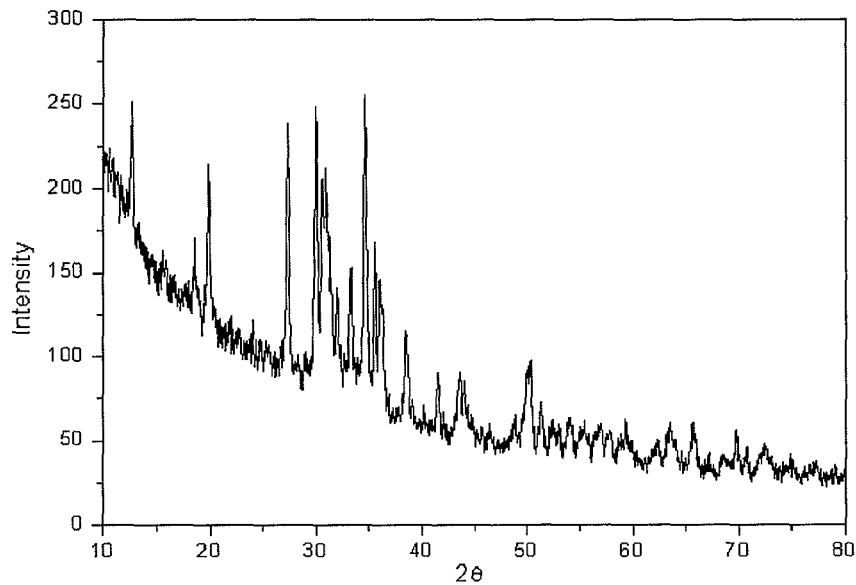
FIG. 5 is a graph illustrating X-ray diffraction pattern of the nitride red phosphor according to the present invention.

A result obtained by observing an X-ray diffraction pattern of the nitride red phosphor according to the present invention is shown in FIG. 5. FIG. 5 is a graph illustrating an X-ray diffraction pattern of the nitride red phosphor according to the present invention.

Referring to FIG. 5, a structural analysis result obtained by measurement of an X-ray diffraction pattern of the nitride red phosphor $Ba_{2-x}Re_xAl_ySi_{5-y}N_8$ is illustrated as a graph. The analyzed structure has the highest peak at 29.86° and involves a crystalline structure clearly distinguishable from that of conventional nitrides such as $CaAlSiN_3$ or $M_2Si_5N_8$ (M=Ca, Sr, Ba), or acid nitrides such as $MSi_2O_2N_2$ (M=Ca, Sr, Ba).

EXPERIMENTAL EXAMPLE 4

Examination of Particle Shape of Nitride Red Phosphor

Figure 6:
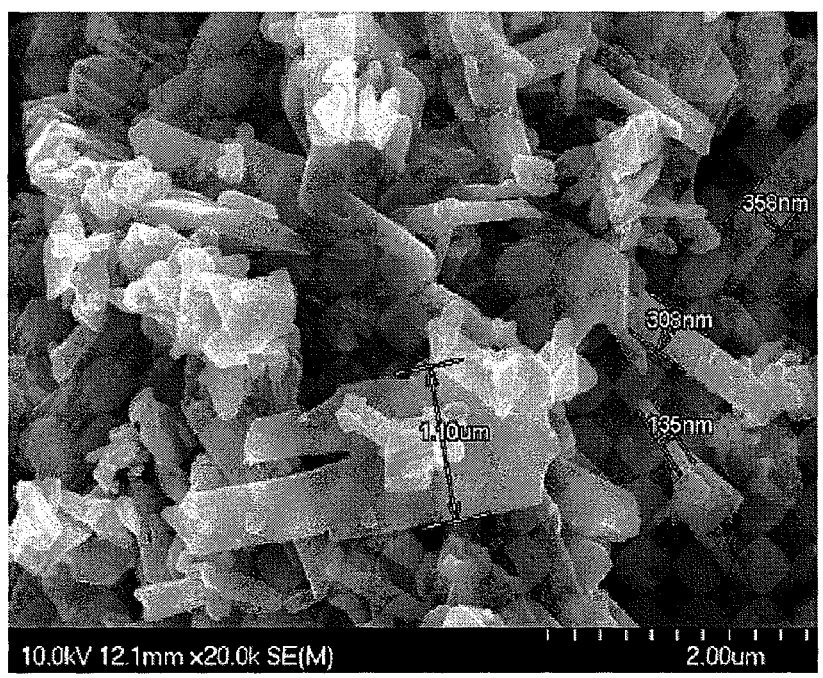
FIG. 6 is an electron microscopic image of the nitride red phosphor according to the present invention.

A result obtained by monitoring a particle shape of the nitride red phosphor according to the present invention is shown in FIG. 6. FIG. 6 is an electron microscopic image of the nitride red phosphor according to the present invention.

Referring to FIG. 6, particles in various forms are observed by SEM measurement of the nitride red phosphor $Ba_{2-x}Re_xAl_ySi_{5-y}N_8$, wherein microfine particles mostly have a length of 3 to 4 μm and some of the particles have a length of not more than 2 μm. Such a size of the phosphor particle is suitable to easily mix the phosphor with an epoxy resin and the like, and in turn, to apply the phosphor to a white LED device.

In general, it is well known that an average particle diameter of LED excitation phosphors is preferably not more than 10 μm. According to the present invention, a white LED or a white LED lamp, which comprises a nitride red phosphor $Ba_{2-x}Re_xAl_ySi_{5-y}N_8$ emitting red light after being excited by light as described above, as well as an LED having a wavelength of 300 to 500 nm, may be manufactured. The white LED or the white LED lamp of the present invention includes a region having a mixture of the phosphor and an epoxy resin or a silicon resin, an epoxy lens, and a lead frame or an electrode wiring to connect electrodes to the outside environment.

EXPERIMENTAL EXAMPLE 5

Optical Properties of Nitride Red Phosphor

Figure 10:
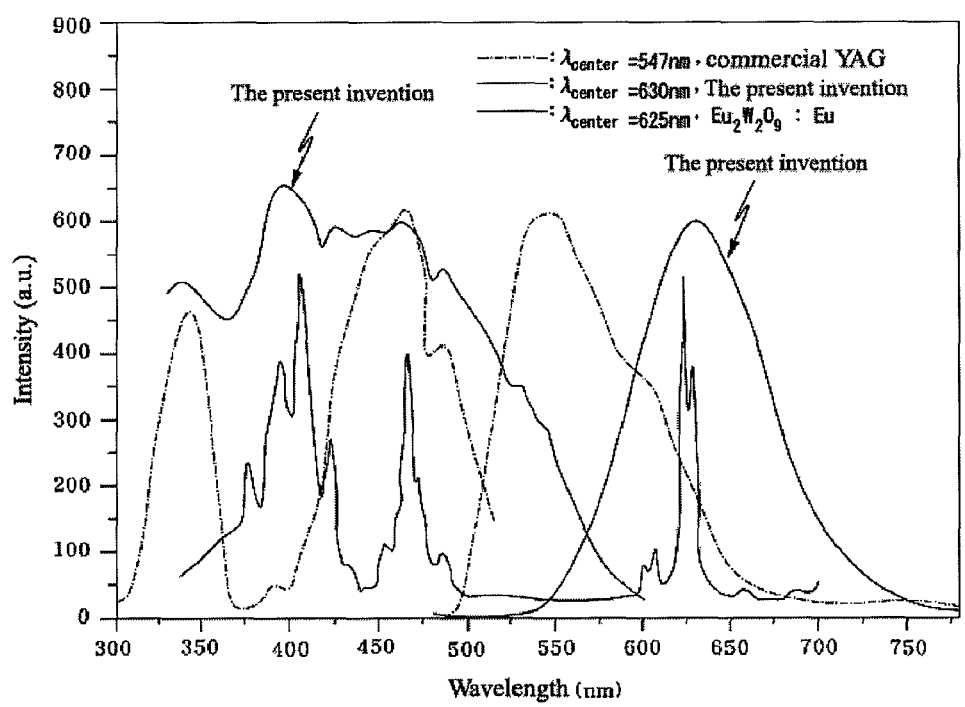
FIG. 10 is a graphical representation illustrating measured results of emission intensity of the nitride red phosphor for blue light excitation according to the present invention, compared to a commercially available YAG product and an Europium-tungsten based red phosphor product ($Eu_2W_2O_9$: $Eu^2$) for an LCD backlight, respectively.

A result obtained by measuring an emission intensity of the nitride red phosphor according to the present invention is shown in FIG. 10. FIG. 10 is a graphical representation illustrating measured results of emission intensities of the nitride red phosphor for blue light excitation according to the present invention, compared to a commercially available YAG product and an Europium-tungsten based red phosphor product $(Eu_2W_2O_9:Eu^2)$ for an LCD backlight, respectively.

Referring to FIG. 10, comparing the inventive nitride red phosphor with the conventional YAG product and the Europium-tungsten based red phosphor product $(Eu_2W_2O_9:Eu^2)$ for an LCD backlight as described above on an area at 610 nm or more, it can be seen that the nitride red phosphor of the present invention exhibits superior performances over the conventional products, because of excitation light from a blue light source of the present invention.

EXPERIMENTAL EXAMPLE 6

Determination of Efficiencies of White LED

Figure 11:
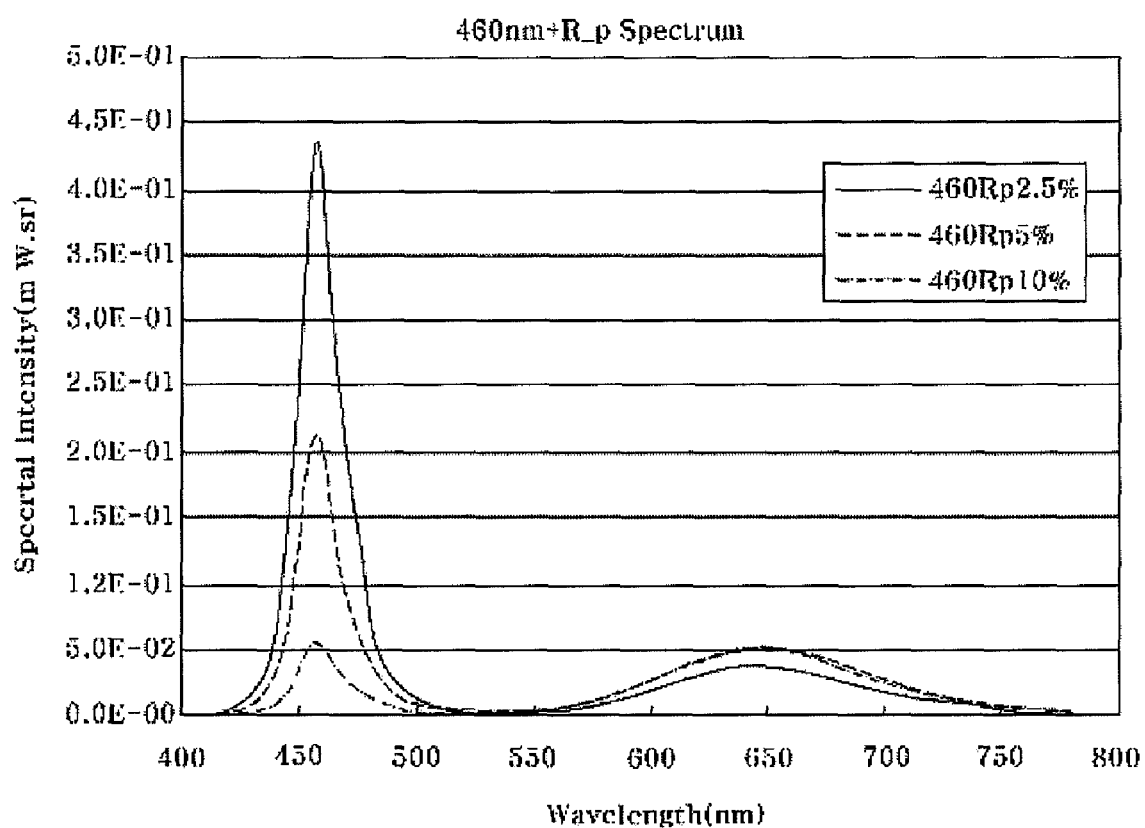
FIG. 11 is a graphical representation illustrating efficiencies of a white LED measured in package experiments of the nitride red phosphor for blue light excitation according to the present invention.

A result obtained by determining efficiencies of a white LED according to the present invention is shown in FIG. 11. FIG. 11 is a graphical representation illustrating efficiencies of the white LED measured in package experiments of the nitride red phosphor for blue light excitation at 460 nm according to the present invention.

Referring to FIG. 11, applying light at 460 nm to R_p 2.5%, R_p 5% and R_p 10%, the light emitted by a lamp was thoroughly collected into an integration device and evaluated by calculating integral values therefrom. The results are estimated as spectral/intensity values as shown in the following TABLE 3.

TABLE 3

| 460 nm | R_p 2.5% | R_p 5% | R_p 10% |
|---|---|---|---|
| 5.00E ± 16 | 3.87E ± 16 | 3.08E ± 16 | 2.15E ± 16 |
| 5.00E ± 16 | 2.55E ± 16 | 1.25E ± 16 | 3.32E ± 16 |

TABLE 3-continued

| 460 nm | R_p 2.5% | R_p 5% | R_p 10% |
|---|---|---|---|
| 0.00E ± 00 | 1.32E ± 16 | 1.83E ± 16 | 1.82E ± 16 |
| 0.00E ± 00 | 2.45E ± 16 | 3.75E ± 16 | 4.67E ± 16 |
|  | 53.9% | 48.8% | 39.0% |

From the above results, it can be seen that the nitride red phosphor $Ba_{2-x}Re_xAl_ySi_{5-y}N_8$ constituting the white light emitting diode package according to the present invention is a novel substance clearly distinguishable from any conventional product in the related art and, especially, may exhibit a maximum photon efficiency of 53.9% at R_p 5%.

The photon efficiency may also be explained by a crystalline structure of a ceramic red phosphor according to the present invention, as described below.

A geometrical structure of crystals in a nitride ceramic phosphor is generally orthorhombic and an oxide phosphor mostly has a hexagonal structure. A typical nitride or oxynitride based phosphor has [Al—N] and [Si—N] ring structures which each includes a $(Si,Al)(O,N)_4$ network structure based on a corner, a face or an edge portion as a host lattice. Such host lattices are overlapped to form a basic framework structure wherein an atom with a larger ionic radius is located at the center of the basic framework structure and some rare-earth metal elements such as Ce, Tb, Eu, Y, etc. are located around the large atom owing to an unbalance of charges, thus activating the phosphor.

Consequently, the nitride red phosphor of the present invention exhibits optical properties varied depending on stoichiometric ingredients, that is, Ca, Sr, Mg, Zn as well as Re species (Ce, Pr, Eu, Tb, Yb, Er) in $Ba_{2-x}Re_xAl_ySi_{5-y}N_8$. Additionally, since at least one or more of the stoichiometric M elements and Re elements becomes a solid solution in an interstitial or substitutional form at a position of Ba in the phosphor $Ba_{2-x}Re_xAl_ySi_{5-y}N_8$, an optimal structure with a maximum photon absorption extent and structural stability may be formed over an extended wavelength area.

As described above, the white LED based on a blue light and UV-ray LED according to the present invention may exhibit improved efficiencies and high color rendition by exciting a $Ba_{2-x}Re_xAl_ySi_{5-y}N_8$ phosphor at 460 nm, thereby embodying a variety of colors.

While the present invention has been described with reference to the preferred embodiments, it will be understood by those skilled in the related art that various modifications and variations may be made therein without departing from the scope of the present invention as defined by the appended claims.

What is claimed is:

1. A nitride red phosphor represented by the following formula 1:

$$Ba_{2-x}Re_xAl_ySi_{5-y}N_8 \quad \text{[Formula 1]}$$

wherein x and y as molar ratios are defined by $0.0001 \leq x \leq 1.0$ and $0.001 \leq y \leq 5.0$, respectively; and Re is at least one selected from rare-earth elements or transition metal elements.

2. The nitride red phosphor according to claim 1, wherein the nitride red phosphor is activated by a rare-earth element.

3. The nitride red phosphor according to claim 1, wherein an excitation wavelength of the nitride red phosphor ranges from 300 to 500 nm while an emission wavelength thereof ranges from 500 to 800 nm.

4. The nitride red phosphor according to claim 1, wherein Re is at least one metal selected from a group consisting of Ce, Pr, Eu, Tb, Yb, Er and Mn.

5. A method for preparation of the nitride red phosphor as set forth in claim 1, comprising: a first step of heat treating a dried precursor mixture at 500 to 900° C. and ordinary pressure under a gas atmosphere; and a second step of sintering the heat treated mixture at 1,400 to 1,800° C. and ordinary pressure under a gas atmosphere.

6. The method according to claim 5, wherein the gas is selected from nitrogen, argon, a mixture of hydrogen and nitrogen and a mixture of carbon monoxide and carbon dioxide.

7. A white LED including the nitride red phosphor as set forth in claim 1, wherein the nitride red phosphor is excited by a light source for an LED at 300 to 500 nm wavelength range to generate an emission wave having a wave band of 500 to 800 nm so that the diode emits the white light using the emission wave.

8. The white LED according to claim 7, wherein the light source for the LED has a dominant wavelength ranging from 390 to 480 nm.

9. The white LED according to claim 7, wherein red light emitted by the nitride red phosphor has a peak wavelength ranging from 600 to 680 nm.

10. The white LED according to claim 7, wherein Re of the nitride red phosphor is Eu, while x and y as molar ratios are defined by $0.0001 \leq x \leq 1.0$ and $0.001 \leq y \leq 5.0$, respectively.

11. The white LED according to claim 7, wherein the nitride red phosphor is combined with a transparent epoxy or silicon resin and applied to a chip constituting the LED light source by a dispensing process.

12. The white LED according to claim 7, wherein the nitride red phosphor is combined with a transparent epoxy or silicon resin and applied to a chip constituting the LED light source by a transfer molding process.

13. The white LED according to claim 7, wherein the nitride red phosphor is combined with a transparent epoxy or silicon resin and applied to a chip constituting the LED light source by a sputtering or deposition process.

14. A white LED package including the nitride red phosphor as set forth in claim 1, wherein the nitride red phosphor is excited by a light source for an LED at 300 to 500 nm wavelength range to generate an emission wave having a wave band of 500 to 800 nm so that the diode package emits the white light using the emission wave.

15. The white LED package according to claim 14, wherein the package is fabricated in a shell form.

16. The white LED package according to claim 14, wherein the package is fabricated in a surface-mounted form.

17. The white LED package according to claim 16, wherein the surface-mounted package has an epoxy lens.

* * * * *